(12) United States Patent
Chua et al.

(10) Patent No.: US 11,430,641 B1
(45) Date of Patent: Aug. 30, 2022

(54) PROCESSING SYSTEMS AND METHODS TO CONTROL PROCESS DRIFT

(71) Applicant: Applied Materials, Inc., Santa Clara, CA (US)

(72) Inventors: Vivien Chua, Milpitas, CA (US); Prashant Kumar Kulshreshtha, San Jose, CA (US); Zhijun Jiang, San Jose, CA (US); Fang Ruan, Milpitas, CA (US); Diwakar Kedlaya, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/367,089

(22) Filed: Jul. 2, 2021

(51) Int. Cl.
*B08B 7/00* (2006.01)
*H01J 37/32* (2006.01)
*C23C 16/44* (2006.01)
*B08B 7/04* (2006.01)

(52) U.S. Cl.
CPC ...... *H01J 37/32862* (2013.01); *B08B 7/0035* (2013.01); *B08B 7/0071* (2013.01); *B08B 7/04* (2013.01); *C23C 16/4405* (2013.01); *H01J 37/32724* (2013.01); *H01J 2237/332* (2013.01)

(58) Field of Classification Search
CPC ........... H01J 37/32862; H01J 37/32724; H01J 2237/332; B08B 7/0035; B08B 7/0071; B08B 7/04; C23C 16/4405
See application file for complete search history.

(56) References Cited

U.S. PATENT DOCUMENTS

| | | | | | |
|---|---|---|---|---|---|
| 5,843,239 | A | * | 12/1998 | Shrotriya | ............ C23C 16/4405 134/1.1 |
| 2005/0072444 | A1 | * | 4/2005 | Shirayone | ............. B08B 7/0035 134/1.3 |
| 2007/0207275 | A1 | * | 9/2007 | Nowak | ............. H01J 37/32862 427/569 |
| 2008/0092806 | A1 | * | 4/2008 | West | ........................ B08B 1/00 118/70 |
| 2017/0365450 | A1 | * | 12/2017 | Bl | ...................... H01J 37/32862 |
| 2018/0111171 | A1 | * | 4/2018 | Gilchrist | ........... H01J 37/32862 |
| 2018/0330929 | A1 | * | 11/2018 | Arnepalli | .......... H01J 37/32449 |

* cited by examiner

*Primary Examiner* — Sharidan Carrillo
(74) *Attorney, Agent, or Firm* — Kilpatrick Townsend & Stockton LLP

(57) ABSTRACT

Exemplary methods of semiconductor processing may include forming a plasma of a fluorine-containing precursor. The methods may include performing a chamber clean in a processing region of a semiconductor processing chamber. The processing region may be at least partially defined between a faceplate and a substrate support. The methods may include generating aluminum fluoride during the chamber clean. The methods may include contacting surfaces within the processing region with a carbon-containing precursor. The methods may include volatilizing aluminum fluoride from the surfaces of the processing region.

18 Claims, 4 Drawing Sheets

PROCESSING SYSTEMS AND METHODS TO CONTROL PROCESS DRIFT

TECHNICAL FIELD

The present technology relates to systems and methods for semiconductor manufacturing. More specifically, the present technology relates to semiconductor processing and equipment for removing material causing process drift.

BACKGROUND

Integrated circuits are made possible by processes which produce intricately patterned material layers on substrate surfaces. Producing patterned material on a substrate requires controlled methods for forming and removing material. Precursors are often delivered to a processing region and distributed to uniformly deposit or etch material on the substrate. Many aspects of a processing chamber may impact process uniformity, such as uniformity of process conditions within a chamber, uniformity of flow through components, as well as other process and component parameters. Even minor discrepancies across a substrate may impact the formation or removal process. Additionally, cleaning processes may impact fall-on particles that may affect substrate yield and throughput.

Thus, there is a need for improved systems and methods that can be used to produce high quality devices and structures. These and other needs are addressed by the present technology.

SUMMARY

Exemplary methods of semiconductor processing may include forming a plasma of a fluorine-containing precursor. The methods may include performing a chamber clean in a processing region of a semiconductor processing chamber. The processing region may be at least partially defined between a faceplate and a substrate support. The methods may include generating aluminum fluoride during the chamber clean. The methods may include contacting surfaces within the processing region with a carbon-containing precursor. The methods may include volatilizing aluminum fluoride from the surfaces of the processing region.

In some embodiments, the surfaces may include the faceplate of the semiconductor processing chamber. The substrate support may be maintained at a temperature greater than or about 400° C. during the method. The faceplate may be maintained at a temperature of greater than or about 200° C. while contacting the surfaces within the processing region with the carbon-containing precursor. The contacting may be performed subsequent to delivering a substrate into the processing region of the semiconductor processing chamber. Contacting surfaces within the processing region with a carbon-containing precursor may be performed as a plasma-free operation. The methods may include, subsequent to the volatilizing, pumping the processing region from a first pressure to a second pressure below or about 1 Torr. The contacting may include halting plasma formation of the fluorine-containing precursor. The contacting may include flowing the carbon-containing precursor into the processing region of the semiconductor processing chamber. The carbon-containing precursor may be or include a hydrocarbon.

Some embodiments of the present technology may encompass methods of semiconductor processing. The methods may include forming a plasma of a fluorine-containing precursor. The methods may include performing a chamber clean in a processing region of a semiconductor processing chamber to remove deposition residue of a carbon-containing material. The processing region may be at least partially defined between a faceplate and a substrate support. The methods may include generating aluminum fluoride during the chamber clean. The methods may include providing a substrate into the processing region of the semiconductor processing chamber. The methods may include contacting surfaces within the processing region with a carbon-containing precursor. The methods may include volatilizing aluminum fluoride from the surfaces of the processing region.

In some embodiments, the surfaces may include the faceplate of the semiconductor processing chamber. The substrate support may be maintained at a temperature greater than or about 400° C. during the method. The faceplate may be maintained at a temperature of greater than or about 200° C. while contacting the surfaces within the processing region with the carbon-containing precursor. The carbon-containing precursor may be a precursor of the deposition residue. Contacting surfaces within the processing region with a carbon-containing precursor may be performed as a plasma-free operation. The methods may include, subsequent to the contacting, generating a plasma of the carbon-containing precursor. The methods may include depositing a carbon-containing material on the substrate. The methods may include, subsequent to the volatilizing, pumping the processing region from a first pressure to a second pressure below or about 1 Torr. The carbon-containing precursor may be or include a hydrocarbon.

Some embodiments of the present technology may encompass methods of semiconductor processing. The methods may include forming a plasma of a fluorine-containing precursor. The methods may include performing a chamber clean in a processing region of a semiconductor processing chamber to remove deposition residue. The processing region may be at least partially defined between a faceplate and a substrate support. The methods may include generating aluminum fluoride during the chamber clean. The methods may include flowing a carbon-containing precursor into the processing region of the semiconductor processing chamber. The methods may include contacting surfaces within the processing region with the carbon-containing precursor. The methods may include volatilizing aluminum fluoride from the surfaces of the processing region. In some embodiments, contacting surfaces within the processing region with a carbon-containing precursor may be performed as a plasma-free operation.

Such technology may provide numerous benefits over conventional systems and techniques. For example, embodiments of the present technology may improve removal of generated aluminum fluoride during cleaning operations. Additionally, the methods may afford enhanced cleaning operations that can improve process throughput. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
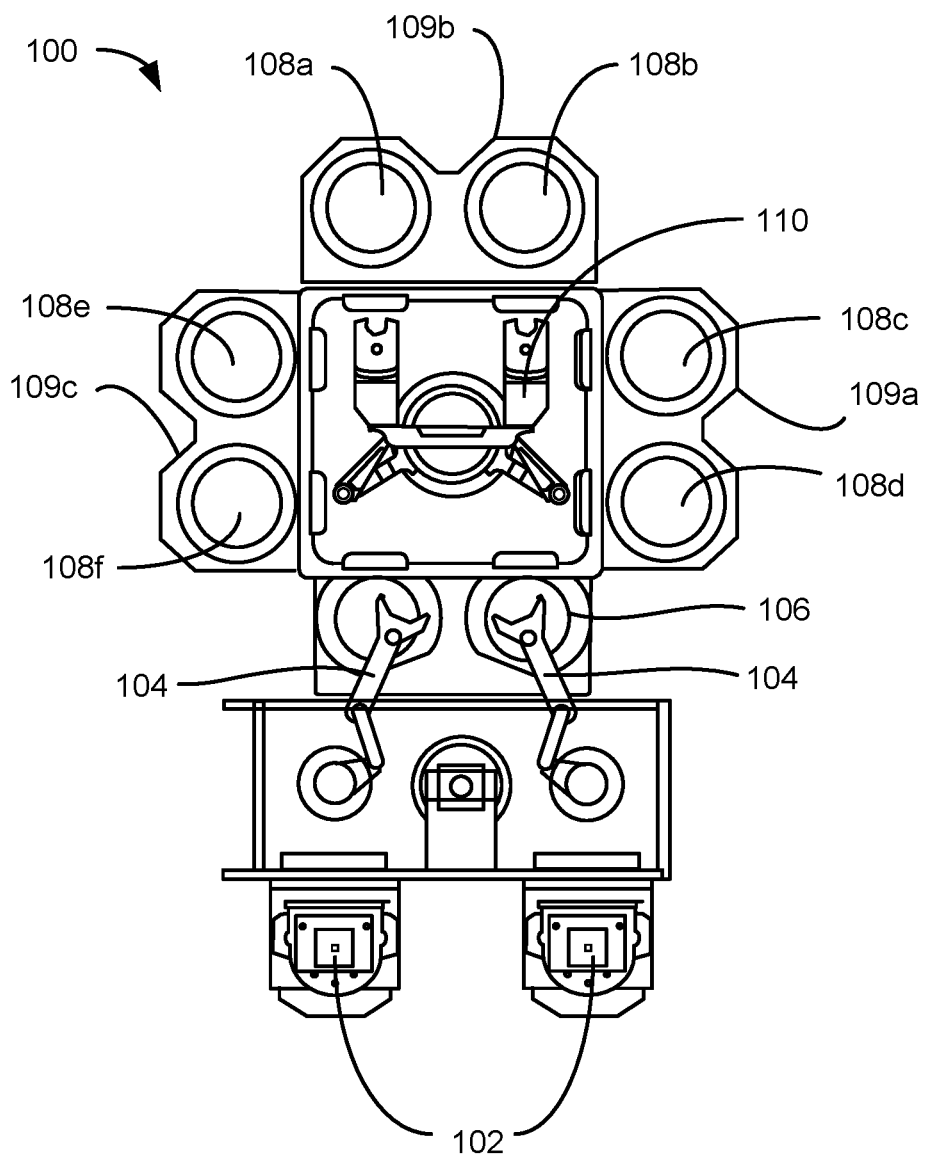
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. Additionally, other dielectric materials may be deposited to separate transistors on a substrate, or otherwise form semiconductor structures. In many processing chambers, a number of precursors may be mixed in a gas panel and delivered to a processing region of a chamber where a substrate may be disposed. The deposition process may deposit material not only on the substrate being processed, but also on chamber components that subsequently may be cleaned.

Cleaning operations may include generating plasma effluents of halogen gases and/or other materials, which may interact with the residual materials producing byproducts that may be exhausted from the chamber. However, as many of the components being cleaned may be or include aluminum, contact with fluorine, for example, may produce aluminum fluoride as a byproduct. As many chamber components may be maintained at a temperature lower or much lower than the substrate being processed, this aluminum fluoride may more readily condense or re-deposit on the faceplate or chamber body walls. The aluminum fluoride may cause a number of issues. For example, the aluminum fluoride may not maintain adherence to the faceplate, and may subsequently fall onto subsequently processed substrates causing damage and yield loss. Additionally, the faceplate may often be operated as a powered electrode for generating plasma during deposition. As the amount of aluminum fluoride buildup increases on the faceplate, plasma characteristics may be impacted, which may cause drift in the process.

To address this issue, conventional technologies have generally attempted to reduce the generation of aluminum fluoride. However, most conventional options may still produce aluminum fluoride. For example, by performing processes at temperatures below or about 400° C., generation of aluminum fluoride may be reduced, although not eliminated. A seasoning may be deposited about the chamber prior to deposition. However, this seasoning may generally be removed during the cleaning process, which, once removed, may still allow the generation of aluminum fluoride. Some conventional technologies may utilize a cover wafer that is placed on the substrate pedestal during cleaning. However, the cover wafer may also be formed of an aluminum-based material, which may still cause the generation of aluminum fluoride when the cover wafer is exposed to cleaning gases.

The present technology overcomes these challenges by addressing aluminum fluoride that may be generated. Although any of the above-noted mitigation options may be employed in some embodiments of the present technology, the present technology may also remove aluminum fluoride generated during cleaning. By utilizing additional precursor interaction, a thermal removal of aluminum fluoride may be performed on chamber components. This may allow processing temperatures to be increased despite a potential increase in aluminum fluoride generation. By removing aluminum fluoride from the faceplate and chamber components, process drift may be reduced, and chamber uptime may be increased. Additionally, cleaning may be performed less conservatively, which may further increase throughput.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include components according to some embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
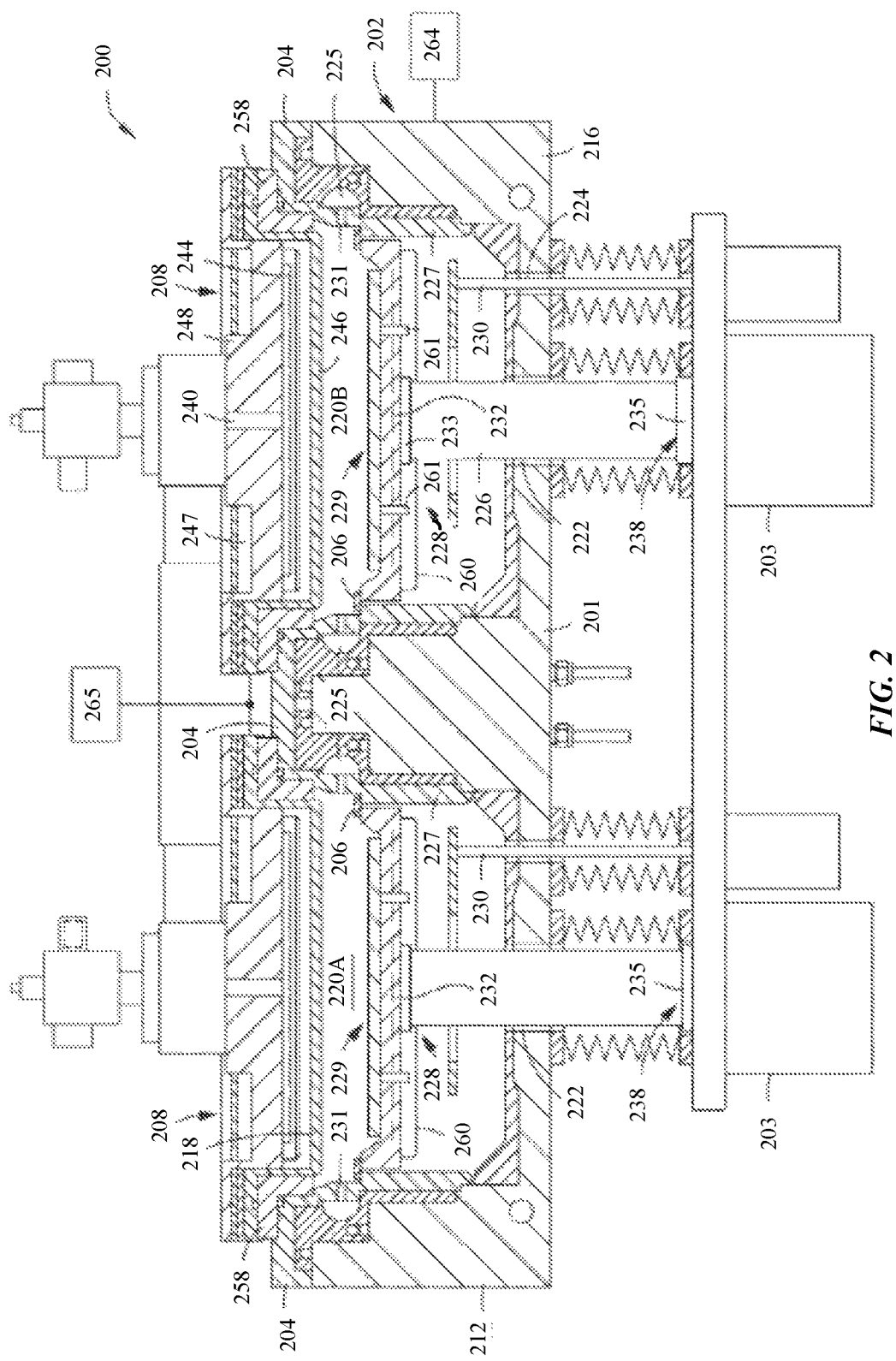
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
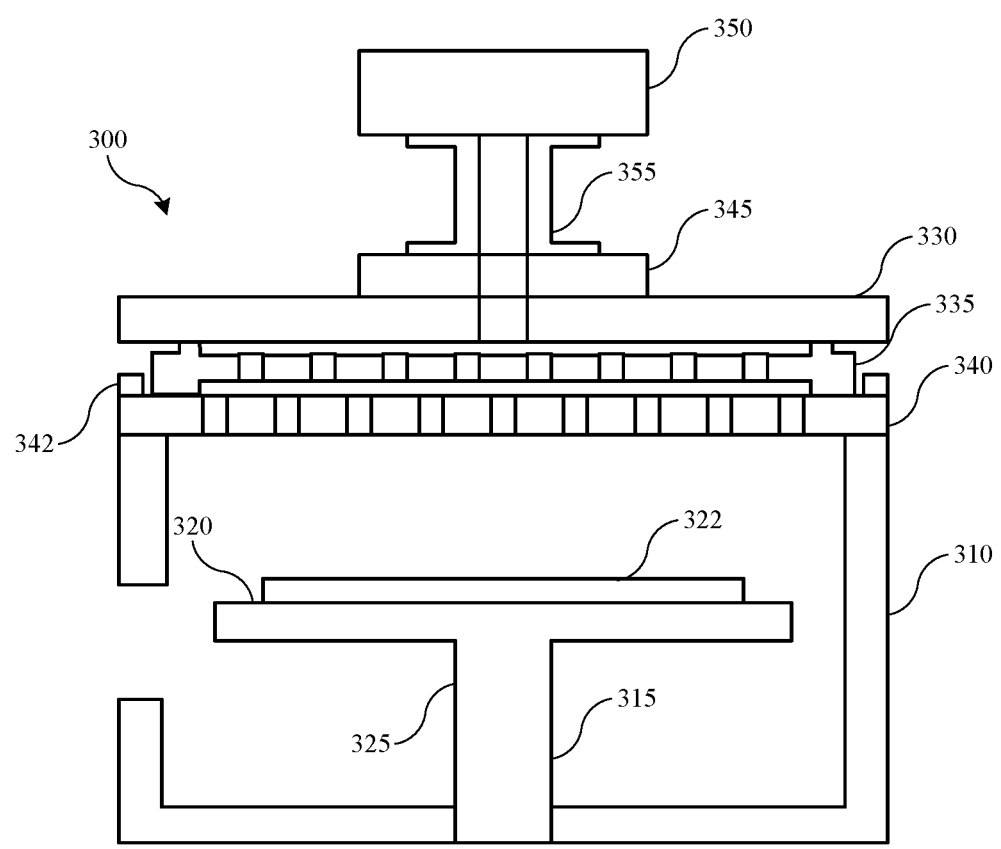
FIG. 3 shows a schematic partial cross-sectional view of an exemplary processing chamber according to some embodiments of the present technology.

FIG. 3 shows a schematic partial cross-sectional view of an exemplary processing system 300 according to some embodiments of the present technology. FIG. 3 may illustrate further details relating to components in system 200, for example. System 300 is understood to include any feature or aspect of system 200 discussed previously in some embodiments. The system 300 may be used to perform semiconductor processing operations including deposition of hardmask or any other materials as previously described, as well as other deposition, removal, and cleaning operations. System 300 may show a partial view of the chamber components being discussed and that may be incorporated in a semiconductor processing system. Any aspect of system 300 may also be incorporated with other processing chambers or systems as will be readily understood by the skilled artisan.

System 300 may include a chamber body 310, which as illustrated may include sidewalls and a base, as well as a lid in some embodiments, all of which may at least partially define an internal volume that may include a processing region where a substrate may be processed. A pedestal or substrate support 315 may extend through the base of the chamber into the processing region as previously discussed. The substrate support may include a support platen 320, which may support semiconductor substrate 322. The support platen 320 may be coupled with a shaft 325, which may extend through the base of the chamber. System 300 may also include lid stack or gas distribution components positioned within or partially defining the interior volume of the chamber, which may facilitate delivery of processing precursors more uniformly through the chamber. The components may include a gasbox 330, which may receive from a gas delivery system a precursor through the lid of the chamber body.

A blocker plate 335 may operate as a choke in some embodiments to facilitate lateral or radial distribution of precursors through the component. The blocker plate 335 may be seated on a faceplate 340, which may define a plurality of apertures through the faceplate as illustrated, and through which precursors may be delivered to access the processing region and substrate. The faceplate may also be coupled with a power source for generating a plasma of the processing precursors within the processing region of the chamber. Components of the lid stack may be temperature controlled to facilitate operations being performed. For example, while gasbox 330 may be cooled, faceplate 340 may be heated in some embodiments. A faceplate heater 342 may be seated on the faceplate 340, and may be configured to heat the faceplate to an operating temperature, such as a temperature at which aluminum fluoride materials may become volatile or may chemically react with carbon-containing materials, as will be explained below. Accordingly, faceplate heater 342 may heat the faceplate to temperatures higher than may standard deposition systems. This additional heat load may cause increased distribution to cooled components, such as the gasbox 330, through blocker plate 335. To limit power requirements for the heater to maintain faceplate temperatures, in some embodiments the blocker plate may have reduced contact with the gasbox, which may lower heat transfer between the components.

For example, blocker plate 335 may have a wider contact surface against the faceplate than with the gasbox. Additionally, a recessed ledge may be formed about the blocker plate at an exterior surface facing the gasbox. This may reduce the contact area with the gasbox, as well as reduce heat transfer between the components. The formed protrusion contacting the gasbox may extend radially a distance sufficient to allow a gasket to be seated between the components. Additionally, to limit additional heating to the blocker plate, in some embodiments faceplate heater 342 may not contact blocker plate 335, and a gap may be maintained between the components. System 300 may include additional components outside of the processing chamber, which may provide access locations for precursors or fluids to be delivered into the chamber.

For example, an outlet manifold 345 may be positioned on the gasbox 330 or some other chamber component, and may provide fluid access into the chamber through a central aperture that may be axially aligned with a central aperture of the gasbox as illustrated. Although not illustrated, it is to be understood that outlet manifold 345 may be fluidly coupled with a weldment or inlet manifold that may provide precursors to the outlet manifold for distribution into the processing chamber. Additionally coupled with the outlet manifold 345 may be a remote plasma source unit 350, which may be seated on an adapter 355. While the outlet manifold may provide access or bypass channels into the processing chamber or to the central aperture for delivering precursors, the central aperture through the outlet manifold may be axially aligned with a central aperture through the adapter 355, and coupled with an outlet of the remote plasma source unit 350. During cleaning operations, or any other semiconductor process operations, the remote plasma source unit may generate plasma effluents to be delivered into the processing chamber for cleaning or other process operations, as will be described further below.

Figure 4:
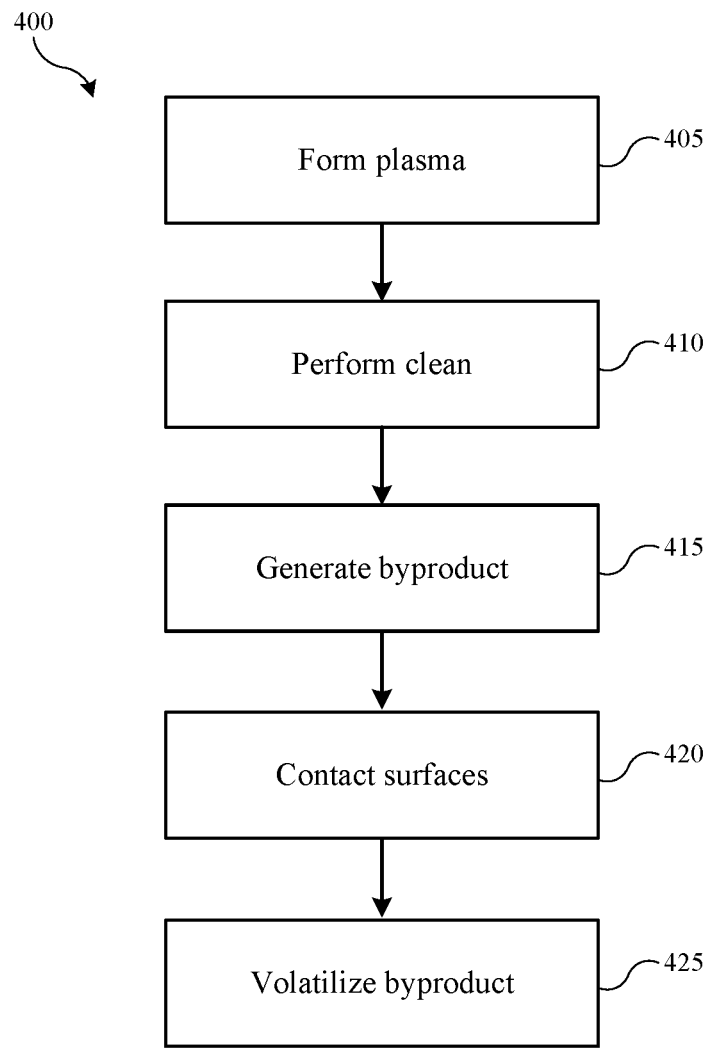
FIG. 4 shows operations of an exemplary method of semiconductor processing according to some embodiments of the present technology.

FIG. 4 shows operations of an exemplary method 400 of semiconductor processing according to some embodiments of the present technology. The method may be performed in a variety of processing chambers, including processing systems 200 and 300 described above, which may include any features or components as previously described. Method 400 may include a number of optional operations, which may or may not be specifically associated with some embodiments of methods according to the present technology. For example, many of the operations are described in order to provide a broader scope of the technology, but are not critical to the technology, or may be performed by alternative methodology as would be readily appreciated.

Method 400 may include additional operations prior to initiation of the listed operations. For example, semiconductor processing may be performed prior to initiating method 400, which may include a deposition operation performed within the processing region of the chamber. Processing operations may be performed in the chamber or system in which method 400 may be performed. For example, once a substrate has been received in a processing chamber, such as including some or all of components from system 300 described above, a deposition operation may be performed on the substrate. The deposition may include depositing any number of materials including hard masks, dielectric materials, metals or other conductive materials, as well as any other deposition operation. Once the deposition has been completed, a processed substrate may be removed from the chamber. Because the deposition process may have deposited materials on multiple surfaces or components of the chamber, a cleaning operation may be performed according to embodiments of the present technology.

Method 400 may include forming a plasma of one or more cleaning precursors in order to clean a processing region of the semiconductor processing chamber. The cleaning precursors may include any number of materials including carrier gases, oxygen or oxygen-containing precursors, hydrogen or hydrogen-containing precursors, as well as one or more halogen-containing precursors. In some embodiments the cleaning precursors may include a fluorine-containing precursor, alone or in addition to any other gas noted previously, and which may be used to generate plasma effluents at operation 405. The fluorine-containing precursor may be or include nitrogen trifluoride, although any fluorine-containing precursor may be used in some embodiments. The plasma may be performed in a remote plasma system unit as previously described, and may be flowed into the processing region of the chamber to remove deposition materials and other byproducts from the chamber, such as by performing a chamber clean at operation 410. Although any surface along the flow path may be cleaned, the flow may be configured to contact exposed surfaces of the faceplate, as well as surfaces within the processing region, such as a pedestal platen, chamber sidewalls, or any other surface that may define the substrate processing region or may be exposed.

As discussed above, many components of the processing chamber may be or include aluminum. The faceplate and chamber walls may be or include aluminum or a coated aluminum material. Additionally, the substrate support may include aluminum and may include aluminum nitride or some other aluminum-containing material as the support surface. When the substrate is removed from the chamber subsequent to the deposition, the support surface may be exposed to the cleaning effluents. Any of these exposed surfaces, including exposure once a seasoning is removed, may allow aluminum fluoride to be produced from interaction of aluminum and the fluorine radicals at operation 415. Temperature may greatly impact generation of aluminum fluoride, and in some embodiments the present technology may perform deposition and/or cleaning operations at substrate or substrate support temperatures greater than or about 400° C., and may perform operations at temperatures greater than or about 450° C., greater than or about 500° C., greater than or about 550° C., greater than or about 600° C., greater than or about 650° C., greater than or about 700° C., or higher. This may further facilitate development of aluminum fluoride. Although some mitigating options may be performed as described above, some amount of aluminum fluoride may be produced during the cleaning.

Other chamber surfaces may be maintained at lower temperatures, and the faceplate and chamber sidewalls may allow aluminum fluoride to condense on the cooler surfaces. Further interaction with cleaning may not impact these fluorine-based residues, and the materials may remain on the surfaces. This may impact subsequent processing by causing fall-on particles to impact substrates, or process drift may occur as the faceplate, which may be the active electrode in deposition, may be coated with aluminum fluoride buildup. To reduce buildup and exhaust aluminum fluoride from the processing chamber, the present technology may perform one or more additional operations to convert the aluminum fluoride into volatile species that may be purged from the chamber.

After the cleaning has been performed, method 400 may contact surfaces within the processing region with a carbon-containing precursor at operation 420. The carbon-containing precursor may be flowed to ensure contact with exposed surfaces in the processing region, such as surfaces of the faceplate and chamber walls, which may be at lower temperatures that cause aluminum fluoride buildup to occur. The carbon-containing precursor may be any number of precursors including carbon. For example, the carbon-containing precursor may be or include a hydrocarbon, including any alkane, alkene, alkyne, or aromatic material, which as non-limiting examples may include ethane, ethene, propane, propene, or any higher-order hydrocarbon, or the precursor may be a material including one or more of carbon, hydrogen, oxygen, or nitrogen. In some embodiments the carbon-containing precursor may include at least one methyl moiety, although in some embodiments the carbon-containing precursor may be delivered with a hydrogen-containing material, which may allow the development of methyl groups that may react with aluminum fluoride to produce an additional byproduct that may be volatile at surface temperatures of the component on which the aluminum fluoride may be attached.

In some embodiments, the carbon-containing precursor may allow development of materials characterized by the general formula $AlF_x(CH_3)_y$, where x and y may be any integer or decimal. These materials may be more volatile than aluminum fluoride, and may be made to vaporize from the chamber surfaces. The process may be performed thermally, and in some embodiments the contacting operation may be performed as a plasma-free operation, and may be performed as a thermally-activated operation. However, the reaction to produce the methylated aluminum fluoride may not occur at temperatures at which many chamber components may be maintained. For example, although a faceplate may be heated during deposition operations or processing, the temperature may not be sufficient to afford the reaction. Accordingly, in some embodiments, the faceplate may be maintained at a temperature greater than or about 200° C., and may be maintained at a temperature greater than or about 220° C., greater than or about 240° C., greater than or about 260° C., greater than or about 280° C., greater than or about 300° C., or higher. The faceplate may be raised to this temperature during the contacting operation among other operations, or all operations of the method may be performed with the faceplate at any of the noted temperatures. By utilizing higher faceplate temperatures during the contacting, the reaction and production of the volatile byproducts may be facilitated, which may then allow the materials to be removed from surfaces within the processing chamber at operation 425. The materials may then be purged from the chamber.

While the deposition and cleaning operations may be performed at chamber pressures above or about 1 Torr, above or about 3 Torr, above or about 10 Torr, or higher, in some embodiments once the volatile byproducts are produced from aluminum fluoride, an exhaust operation may be performed, which may lower the pressure within the chamber below a deposition or cleaning processing pressure. For example, in some embodiments the pressure may be reduced to less than or about 1 Torr, and may be reduced to less than or about 750 mTorr, less than or about 500 mTorr, less than or about 250 mTorr, less than or about 100 mTorr, or less. This may allow additional aluminum fluoride to be purged from the chamber, and lower the possibility of re-deposition on additional chamber surfaces.

The contacting operation of method 400 may be performed in one or more ways, depending on the overall process being performed. For example, in some embodiments the carbon-containing precursor may be delivered subsequent to processing with fluorine radical species. Hence, after a sufficient cleaning time, plasma generation of the fluorine-containing precursor may be halted, and the chamber may be purged. The carbon-containing precursor may then be flowed into the chamber while the chamber is still free of a substrate. The volatilized species may then be pumped from the chamber, and subsequent to processing such as seasoning or substrate delivery may then be performed.

Additionally, some processing that may utilize carbon-containing precursors may include particular operations to facilitate aluminum fluoride removal prior to deposition. For example, in some embodiments after the cleaning operation has been performed to remove deposition residue or byproducts, and for which a carbon-containing deposition may be performed, a subsequent substrate may be delivered to the processing region of the chamber. Although the subsequent deposition may include a plasma-enhanced deposition, prior to striking a plasma, the carbon-containing precursor may be flowed into the processing region to produce the volatile aluminum fluoride byproducts, which may then be pumped from the chamber. The flow of the carbon-containing precursor may then continue or be adjusted along with delivery of one or more additional precursors, while a plasma is struck to proceed with deposition of a carbon-containing material. Accordingly, the carbon-containing precursor that may be a precursor of the deposition residue may also be used to facilitate removal of aluminum fluoride from chamber components. Similarly, if a seasoning to be applied to the chamber may be formed with a suitable carbon-containing precursor, prior to delivery of the substrate or any seasoning plasma development, the carbon-containing precursor may be flowed into the chamber to produce the volatile byproducts of aluminum fluoride, followed by purging and subsequent plasma enhancement of the seasoning precursor.

Additional operations may also be performed in some embodiments to facilitate development and removal of aluminum fluoride. For example, in some embodiments aluminum fluoride residue may also be deposited on a slit valve, or entrance to the processing chamber, which may be a cooler surface. After a substrate has been removed subsequent deposition, a substrate support may be raised back to operating position during cleaning. However, in some embodiments of the present technology, method 400 may include lowering the substrate support to a level in line with or below a slit valve or access to the chamber. The movement of the substrate support may occur during the cleaning operation, for example, such as after an initial period of time at which the substrate support is maintained at a processing or cleaning height. The flow of the carbon-containing precursor may be continuous during the movement of the substrate support. This may allow additional surfaces to be cleaned of aluminum fluoride.

In many conventional processes in which aluminum fluoride mitigation is performed, the cleaning process itself may be tailored in an attempt to limit aluminum fluoride development. In addition to reducing processing temperatures, the cleaning process may be performed with minimal amounts of fluorine-containing precursor. However, because the present technology removes generated aluminum fluoride, production may be less of an issue, and thus, a more aggressive cleaning may be performed. For example, in some embodiments, cleaning times may be reduced significantly by increasing flow of the fluorine-containing precursor. The present technology may limit process drift by over 90% per one-hundred substrates, and thus development of aluminum fluoride during cleaning can be better controlled. Accordingly, unlike conventional technologies, the process may include performing the cleaning operation at a flow rate of the fluorine-containing precursor of greater than or about 500 sccm, and may include utilizing a flow rate of greater than or about 600 sccm, greater than or about 700 sccm, greater than or about 800 sccm, greater than or about 900 sccm, greater than or about 1000 sccm, greater than or about 1100 sccm, greater than or about 1200 sccm, or more. This may allow cleaning times to be less than or about 4 minutes, and may be less than or about 3.5 minutes, less than or about 3 minutes, less than or about 2.5 minutes, less than or about 2 minutes, or less, which conventional technologies may be incapable of performing without dramatically increasing aluminum fluoride production and defect generation or process drift during subsequent deposition. By utilizing methods according to the present technology, process drift and fall-on particles may be limited by performing removal of generated aluminum fluoride during cleaning operations.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method, comprising:
forming a plasma of a fluorine-containing precursor;
performing a chamber clean in a processing region of a semiconductor processing chamber, wherein the processing region is at least partially defined between a faceplate and a substrate support;
generating aluminum fluoride during the chamber clean;
halting plasma formation of the fluorine-containing precursor;
contacting surfaces within the processing region with a carbon-containing precursor, wherein contacting the surfaces within the processing region with the carbon-containing precursor is performed as a plasma-free operation;
volatilizing the aluminum fluoride from the surfaces of the processing region; and
reducing a pressure in the processing region.

2. The method of claim 1, wherein the surfaces comprise the faceplate of the semiconductor processing chamber.

3. The method of claim 1, further comprising:
delivering a substrate into the processing region of the semiconductor processing chamber subsequent to generating the aluminum fluoride during the chamber clean.

4. The method of claim 1, further comprising:
subsequent to the volatilizing, pumping the processing region from a first pressure to a second pressure below or about 1 Torr, wherein the first pressure is greater than the second pressure.

5. The method of claim 1, wherein the contacting further comprises:
flowing the carbon-containing precursor into the processing region of the semiconductor processing chamber.

6. The method of claim 1, wherein the carbon-containing precursor comprises a hydrocarbon.

7. The method of claim 2, wherein the substrate support is maintained at a temperature greater than or about 400° C.

8. The method of claim 7, wherein the faceplate is maintained at a temperature of greater than or about 200° C.

9. A method, comprising:
forming a plasma of a fluorine-containing precursor;
performing a chamber clean in a processing region of a semiconductor processing chamber to remove deposition residue of a carbon-containing material, wherein the processing region is at least partially defined between a faceplate and a substrate support;
generating aluminum fluoride during the chamber clean;

contacting surfaces of the processing region with a carbon-containing precursor, wherein the substrate support is maintained at a greater temperature than the faceplate; and volatilizing the aluminum fluoride from the surfaces of the processing region.

10. The method of claim 9, wherein the surfaces comprise the faceplate of the semiconductor processing chamber.

11. The method of claim 9, wherein the carbon-containing precursor is a precursor of the deposition residue.

12. The method of claim 9, wherein contacting the surfaces within the processing region with the carbon-containing precursor is performed as a plasma-free operation.

13. The method of claim 9, further comprising:
subsequent to the volatilizing, pumping the processing region from a first pressure to a second pressure below or about 1 Torr.

14. The method of claim 9, wherein the carbon-containing precursor comprises a hydrocarbon.

15. The method of claim 10, wherein the substrate support is maintained at a temperature greater than or about 400° C.

16. The method of claim 15, wherein the faceplate is maintained at a temperature of greater than or about 200° C.

17. A method, comprising:
forming a plasma of a fluorine-containing precursor;
performing a chamber clean in a processing region of a semiconductor processing chamber to remove deposition residue, wherein the processing region is at least partially defined between a faceplate and a substrate support;
generating aluminum fluoride during the chamber clean;
halting plasma formation of the fluorine-containing precursor;
flowing a carbon-containing precursor into the processing region of the semiconductor processing chamber;
contacting surfaces within the processing region with the carbon-containing precursor, wherein contacting the surfaces within the processing region with the carbon-containing precursor is performed as a plasma-free operation; and
volatilizing the aluminum fluoride from the surfaces of the processing region.

18. The method of claim 17, wherein the substrate support is maintained at a greater temperature than the faceplate.

* * * * *